(12) United States Patent
Sinharoy et al.

(10) Patent No.: US 9,740,112 B2
(45) Date of Patent: Aug. 22, 2017

(54) PATTERNING DEVICE SUPPORT AND LITHOGRAPHIC APPARATUS

(71) Applicants: ASML Holding N.V., Veldhoven (NL); ASML Netherlands B.V., Veldhoven (NL)

(72) Inventors: Arindam Sinharoy, Furlong, PA (US); Stephen S. Roux, New Fairfield, CT (US); Jean-Philippe Xavier Van Damme, Wezembeek-Oppem (BE); Daniel Nathan Burbank, Ridgefield, CT (US); Mark Josef Schuster, Fairfield, CT (US); Duncan Harris, Fairfield, CT (US); Christopher Charles Ward, Somerville, MA (US)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 70 days.

(21) Appl. No.: 14/436,070

(22) PCT Filed: Sep. 23, 2013

(86) PCT No.: PCT/EP2013/069654
§ 371 (c)(1),
(2) Date: Apr. 15, 2015

(87) PCT Pub. No.: WO2014/063874
PCT Pub. Date: May 1, 2014

(65) Prior Publication Data
US 2015/0277240 A1    Oct. 1, 2015

Related U.S. Application Data

(60) Provisional application No. 61/719,014, filed on Oct. 26, 2012, provisional application No. 61/836,284, filed on Jun. 18, 2013.

(51) Int. Cl.
*G03F 7/20* (2006.01)

(52) U.S. Cl.
CPC .......... *G03F 7/70733* (2013.01); *G03F 7/707* (2013.01); *G03F 7/70783* (2013.01)

(58) Field of Classification Search
CPC ... G03F 7/707; G03F 7/70733; G03F 7/70783
See application file for complete search history.

(56) References Cited

U.S. PATENT DOCUMENTS

| 4,737,824 A | 4/1988 | Sakai et al. |
| 5,534,969 A | 7/1996 | Miyake |

(Continued)

FOREIGN PATENT DOCUMENTS

| DE | GB 1193297 A | * | 5/1970 | ............. G03F 7/707 |
| EP | 0 284 003 A1 | | 9/1988 | |

(Continued)

OTHER PUBLICATIONS

English-Language Abstract for Japanese Patent Publication No. 2001-085297 A, published Mar. 30, 2001; 1 page.

(Continued)

*Primary Examiner* — Michelle M Iacoletti
(74) *Attorney, Agent, or Firm* — Sterne, Kessler, Goldstein & Fox P.L.L.C.

(57) ABSTRACT

A patterning device support (200), for example, a patterning device (202) or substrate support, can be configured to release internal stresses of a patterning device loaded thereon. The patterning device support can include a positive pressuring generating interface (206a, 206b) or an acoustic vibration generating interface (206a, 206b), or can be configured to oscillate while at least a portion of patterning device is decoupled from the patterning device support. A method of transferring a patterning device between a patterning device handling apparatus and a patterning device (Continued)

support configured to move the patterning device can include positioning the patterning device onto a surface of the patterning device support, and performing a process that releases internal stress of the patterning device.

27 Claims, 8 Drawing Sheets

(56) References Cited

U.S. PATENT DOCUMENTS

| | | | |
|---|---|---|---|
| 6,094,255 | A | 7/2000 | Ota |
| 2001/0026897 | A1 | 10/2001 | Shima |
| 2005/0039685 | A1 | 2/2005 | Eiriksson et al. |
| 2005/0211867 | A1* | 9/2005 | Margeson ......... H01L 21/68728 248/550 |
| 2006/0279721 | A1 | 12/2006 | Baggen et al. |
| 2009/0059199 | A1 | 3/2009 | Kuit et al. |
| 2009/0086180 | A1 | 4/2009 | Ottens et al. |
| 2010/0159399 | A1 | 6/2010 | Vermeulen et al. |
| 2010/0195080 | A1 | 8/2010 | Compen et al. |
| 2012/0133914 | A1* | 5/2012 | Prosyentsov ............. G03F 1/44 355/53 |

FOREIGN PATENT DOCUMENTS

| | | |
|---|---|---|
| JP | 2001-085297 A | 3/2001 |
| JP | 2006-108131 A | 4/2006 |
| JP | 2006-352115 A | 12/2006 |
| JP | 2010-040577 A | 2/2010 |
| JP | 2011-013565 A | 1/2011 |
| JP | 2011-114314 A | 6/2011 |
| JP | 2012-151490 A | 8/2012 |
| KR | 10-2007-0002198 A | 1/2007 |

OTHER PUBLICATIONS

English-Language Abstract for Japanese Patent Publication No. 2006-108131 A, published Apr. 20, 2006; 1 page.
English-Language Abstract for Korean Patent Publication No. 10-2007-0002198 A, published Jan. 5, 2007; 1 page.
English-Language Abstract for Japanese Patent Publication No. 2010-040577 A, published Feb. 18, 2010; 1 page.
International Search Report directed to related International Patent Application No. PCT/EP2013/069654, mailed Jan. 2, 2014; 5 pages.
International Preliminary Report on Patentability and Written Opinion of the International Searching Authority directed to related International Patent Application No. PCT/EP2013/069654, issued Apr. 28, 2015; 9 pages.
English-Language Abstract for Japanese Patent Publication No. 2011-013565 A, published Jan. 20, 2011; 1 page.
English-Language Abstract for Japanese Patent Publication No. 2011-114314 A, published Jun. 9, 2011; 1 page.

* cited by examiner

PATTERNING DEVICE SUPPORT AND LITHOGRAPHIC APPARATUS

CROSS-REFERENCE TO RELATED APPLICATION

This application is related to U.S. Provisional Patent Application No. 61/719,014, filed Oct. 26, 2012 and U.S. No. 61/836,284, filed Jun. 18, 2013 which is incorporated by reference herein in its entirety.

BACKGROUND

Field

Embodiments of the present invention generally relate to apparatuses for supporting an exchangeable object, and more particularly to apparatuses and methods for supporting and exchanging an object, for example, a patterning device or substrate, for use in a lithographic apparatus.

Background Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, for example, a mask or a reticle, may be used to generate a circuit pattern to be formed on an individual layer of the IC. This pattern can be transferred onto a target portion (for example, including part of, one, or several dies) on a substrate (for example, a silicon wafer). Transfer of the pattern is typically via imaging onto a layer of radiation-sensitive material (resist) provided on the substrate. Generally, a single substrate will contain a network of adjacent target portions that are successively patterned. Conventional lithographic apparatuses include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Manufacturing ICs sometimes requires imaging different patterns on different layers of ICs using different patterning devices, for example, reticles. Accordingly, patterning devices must be exchanged during the lithographic process. Some lithographic apparatuses include a patterning device handling apparatus that exchanges the patterning devices. To load the patterning device on a patterning device support of the lithographic apparatus, a gripping device of the patterning device handling apparatus couples with the patterning device, for example, by using vacuum suction. Then, the patterning device handling apparatus moves the patterning device (for example, by rotating about a turret) towards the patterning device support to load the patterning device.

Generally, the gripping device lowers the patterning device onto the patterning device support. While the gripping device is still coupled to the patterning device, the patterning device support clamps, for example, by creating a vacuum, the patterning device to a surface. The gripping device then releases the patterning device, leaving the patterning device loaded on the patterning device support.

During the loading sequence, the patterning device may accumulate internal mechanical stresses. For example, geometrical non-conformity between the vacuum pads of the gripping device and the surface of the patterning device can deform the patterning device to create stresses. The weight of the gripper can also deform the patterning device when placed on the patterning device support. Internal stresses can also be created by manufacturing tolerances, damage, or wear to the clamping interfaces of the patterning device support. Contamination can also create internal stresses in the patterning device. Contamination particles between the clamping interfaces and the patterning device can deform the patterning device. Because the patterning device support couples with the patterning device while the gripper is also coupled to the patterning device, these internal stresses in the patterning device cannot be partially or fully relieved when transferred to the patterning device support. Stresses or deformations in the patterning device can cause non-deterministic distortions that can lead to overlay errors. Internal stress in the patterning device can be difficult to reproduce between load-to-load, reticle-to-reticle, gripper-to-gripper, and machine-to-machine. So internal patterning device stress generally hurt reproducibility.

SUMMARY

Accordingly, there is need for patterning device supports, lithographic apparatuses, and methods of exchanging a patterning device that reduce or eliminate stress or deformation in the patterning device.

In some embodiments, a patterning device support comprising a moveable component configured to move a patterning device and having a surface that supports the patterning device. The support also comprising a clamping interface on the moveable component, the clamping interface being configured to couple the patterning device to the moveable component. Additionally, the support comprises a pressure applying interface on the movable component. The pressure applying interface is configured to apply an area of positive fluid pressure on a surface of the patterning device such that a friction force between the patterning device and the surface of the movable component that supports the patterning device is reduced.

In some embodiments, a method of transferring a patterning device between a patterning device handling apparatus and a patterning device support configured to move the patterning device comprises positioning the patterning device on a surface of the patterning device support and decoupling the patterning device from the patterning device handling apparatus. The method also includes applying an area of positive fluid pressure on a surface of the patterning device such that a friction force between the patterning device and the surface of the patterning device support is reduced. Further, the method includes clamping the patterning device to the patterning device support.

In some embodiments, a method of transferring a patterning device between a patterning device handling apparatus and a patterning device support configured to move the patterning device and having a surface that supports the patterning device comprises positioning the patterning device coupled to the patterning device handling apparatus on the patterning device support. The method also includes decoupling the patterning device from the patterning device handling apparatus and oscillating the patterning device support such that residual stresses or distortion in the patterning device generated by coupling the patterning device to the patterning device handling apparatus are reduced or eliminated. Additionally, the method includes coupling the patterning device to the patterning device support.

In some embodiments, a method of transferring a patterning device between a patterning device handling apparatus and a patterning device support configured to move the patterning device comprises positioning the patterning device onto a surface of the patterning device support. The method also includes performing a process that releases internal stress of the patterning device and constraining the patterning device such that movement of the patterning device relative to the patterning device support is substantially prevented.

In some embodiments, a patterning device support comprises a moveable component configured to move a patterning device and a clamping interface attached to the moveable component. The clamping interface is configured to couple the patterning device to the moveable component. The support also comprises an acoustic vibration generating interface configured to generate acoustic vibration that contacts the patterning device.

In some embodiments, a patterning device support comprises a moveable component configured to move a patterning device, and a clamping interface attached to the moveable component. The clamping interface is configured to selectively couple the patterning device to the moveable component. The moveable component is configured to oscillate in a manner that internal stress in the pattering device is at least partially released.

In some embodiments, a lithographic apparatus comprises a patterning device support configured to move a patterning device. The patterning device support comprises a moveable component configured to move a patterning device in a plane. The support also comprises a clamping interface attached to the moveable component, the clamping interface being configured to selectively couple the patterning device to the moveable component. The support also includes a pressure applying interface configured to selectively apply an area of positive fluid pressure on a surface of the patterning device such that the patterning device floats a distance from a surface of the clamping interface.

In some embodiments, a patterning device support comprises a surface for supporting a patterning device, and a clamping interface having a surface. The clamping interface is configured to hold the patterning device. The patterning device has a major planar surface and side edges. The support also includes a pressure applying interface positioned near the patterning device during the operational use of the patterning device. The pressure applying interface is configured to selectively apply a net force under the major planar surface of the patterning device by applying an area of positive fluid pressure at the major planar surface of the patterning device such that the patterning device floats at a distance from the surface of the clamping interface.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention.

Figure 1:
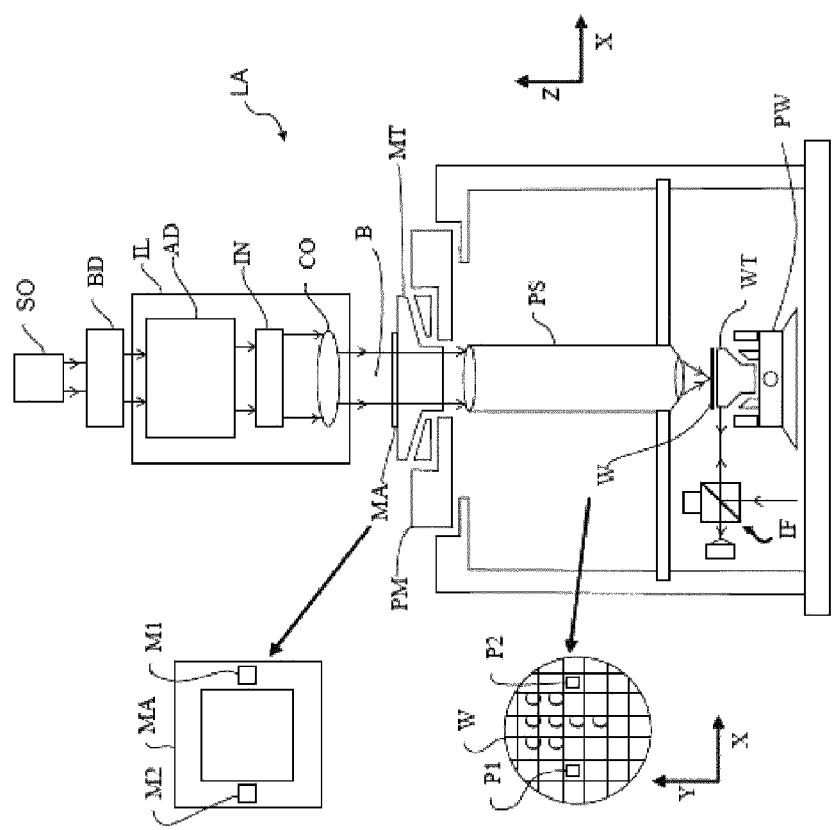
FIG. 1 schematically depicts a lithographic apparatus according to an embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, or structurally similar elements. The drawing in which an element first appears is indicated by the leftmost digit(s) in the corresponding reference number.

DETAILED DESCRIPTION

This specification discloses embodiments that incorporate the features of this invention. The disclosed embodiments merely exemplify the invention. The scope of the invention is not limited to the disclosed embodiments. The invention is defined by the claims appended hereto.

The embodiments described, and references in the specification to "one embodiment," "an embodiment," "an example embodiment," "an example," "some embodiments," etc., indicate that the embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In some embodiments, a lithographic apparatus can include an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

In the embodiments described below, the terms "lens" and "lens element," where the context allows, may refer to any one or combination of various types of optical components, comprising refractive, reflective, magnetic, electromagnetic and electrostatic optical components.

Also, in the embodiments described below, the terms "long stroke," "short stroke," and "ultra-short stroke" are used to indicate a relative difference between the distances of each stroke.

Further, the terms "radiation" and "beam" used herein encompass all types of electromagnetic radiation, comprising ultraviolet (UV) radiation (for example, having a wavelength λ of 365, 248, 193, 157 or 126 nm), extreme ultra-violet (EUV or soft X-ray) radiation (for example, having a wavelength in the range of 5-20 nm, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within the lithographic apparatus. It should be appreciated that radiation having a wavelength in the range of, for example, 5-20 nm relates to radiation with a certain wavelength band, of which at least part is in the range of 5-20 nm.

Before describing such embodiments in more detail, however, it is instructive to present an example environment in which embodiments of the present invention may be implemented.

FIG. 1 schematically depicts lithographic apparatus LA. Lithographic apparatus LA includes an illumination system (illuminator) IL configured to condition a radiation beam B (for example, DUV or EUV radiation); a patterning device support structure (for example, a mask table) MT configured to support a patterning device (for example, a mask, a reticle, or a dynamic patterning device) MA and connected to a first positioning system PM configured to accurately position or manipulate the support structure MT and the patterning device MA; and a substrate table (for example, a wafer table) WT configured to hold a substrate (for example, a resist coated wafer) W and connected to a second positioning system PW configured to accurately position the substrate table WT and the substrate W. Lithographic apparatus LA can also have a projection system PS configured to project a pattern imparted to the radiation beam B by patterning device MA onto a target portion (for example, comprising one or more dies) C of the substrate W. In lithographic apparatus LA, the patterning device MA and the projection system PS are transmissive.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatus LA, and other conditions, for example, whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit. The patterning device MA may be transmissive (as in lithographic apparatus LA) or reflective (not shown). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus LA may be of a type having two (dual stage) or more substrate tables WT or two or more support structures MT. In such "multiple stage" machines, the additional substrate tables WT or support structures MT may be used in parallel, or preparatory steps may be carried out on one or more tables while one or more other substrate tables WT or support structures MT are being used for exposure.

The illuminator IL receives a radiation beam from a radiation source SO. The source SO and the lithographic apparatus LA may be separate entities, for example, when the source SO is an excimer laser. In such cases, the source SO is not considered to form part of the lithographic apparatus LA, and the radiation beam B passes from the source SO to the illuminator IL with the aid of a beam delivery system BD comprising, for example, suitable directing mirrors or a beam expander. In other cases, the source SO may be an integral part of the lithographic apparatus LA, for example, when the source SO is a mercury lamp. The source SO and the illuminator IL, together with the beam delivery system BD, if required, may be referred to as a radiation system.

The illuminator IL may comprise an adjuster AD for adjusting the angular intensity distribution of the radiation beam. Generally, at least the outer or inner radial extent (commonly referred to as σ-outer and σ-inner, respectively) of the intensity distribution in a pupil plane of the illuminator may be adjusted. In addition, the illuminator IL may comprise various other components, such as an integrator IN and a condenser CO. The illuminator IL may be used to condition the radiation beam B to have a desired uniformity and intensity distribution in its cross section.

The radiation beam B is incident on the patterning device (for example, a mask or reticle) MA, which is held on the support structure (for example, a mask table or wafer stage) WT, and is patterned by the patterning device MA. Having traversed the patterning device MA, the radiation beam B passes through the projection system PS, which focuses the beam onto a target portion C of the substrate W. With the aid of the second positioning system PW, which can include one or more force actuators (for example, servomechanisms or any other suitable force actuators) and one or more position sensors IF (for example, an interferometric device, linear encoder, capacitive sensor, or any other suitable position sensing device) in some embodiments, the substrate table WT and substrate W can be moved accurately, for example, so as to position different target portions C in the path of the radiation beam B. Similarly, the first positioning system PM, which can include one or more force actuators (for example, servomechanisms or any other suitable force actuator) and one or more position sensors (for example, an interferometric device, linear encoder, a capacitive sensor, or any other suitable position sensing device, and which are not shown in FIG. 1) in some embodiments, can be used to accurately position the support structure MT and patterning device MA with respect to the path of the radiation beam B, for example, after mechanical retrieval from a mask library, or during a scan.

Generally, movement of the support structure MT may be realized with the aid of a long-stroke component (coarse positioning) and a short-stroke component (fine positioning), which form part of the first positioning system PM. Similarly, movement of the substrate table WT may be realized using a long-stroke component and a short-stroke component, which form part of the second positioning system PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatus LA may be used in at least one of the following modes:

1. In step mode, the support structure (for example, mask table or wafer stage) MT and the substrate table WT are kept essentially stationary, while an entire pattern imparted to the radiation beam B is projected onto a target portion C at one time (i.e., a single static exposure). The substrate table WT is then shifted in the X or Y direction so that a different target portion C may be exposed.

2. In scan mode, the support structure MT and the substrate table WT are scanned synchronously while a pattern imparted to the radiation beam B is projected onto a target portion C (i.e., a single dynamic exposure). The velocity and direction of the substrate table WT relative to the support structure MT may be determined by the (de-) magnification and image reversal characteristics of the projection system PS.

3. In another mode, the support structure MT is kept generally stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations or variations on the described modes of use or entirely different modes of use may also be employed.

Figure 2:
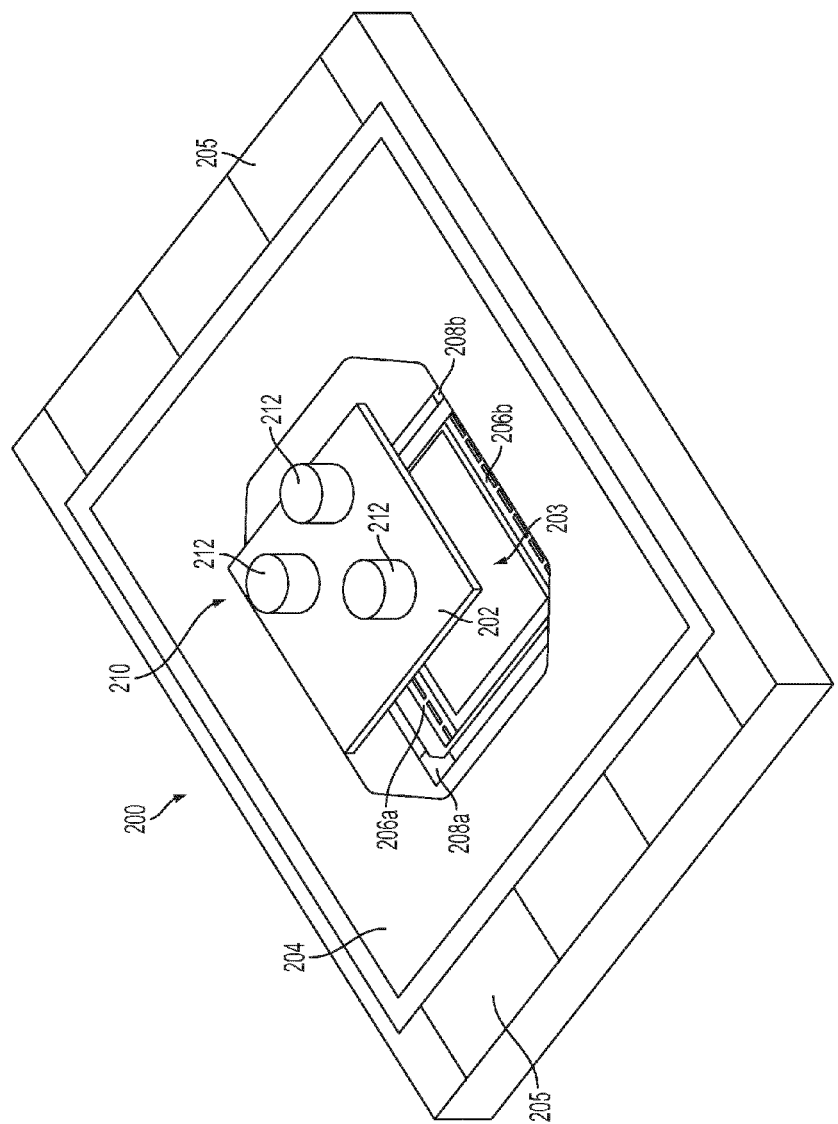
FIG. 2 depicts a perspective view of a patterning device support and a gripping device of a patterning device handling apparatus coupled with a patterning device according to an embodiment.
Figure 3:
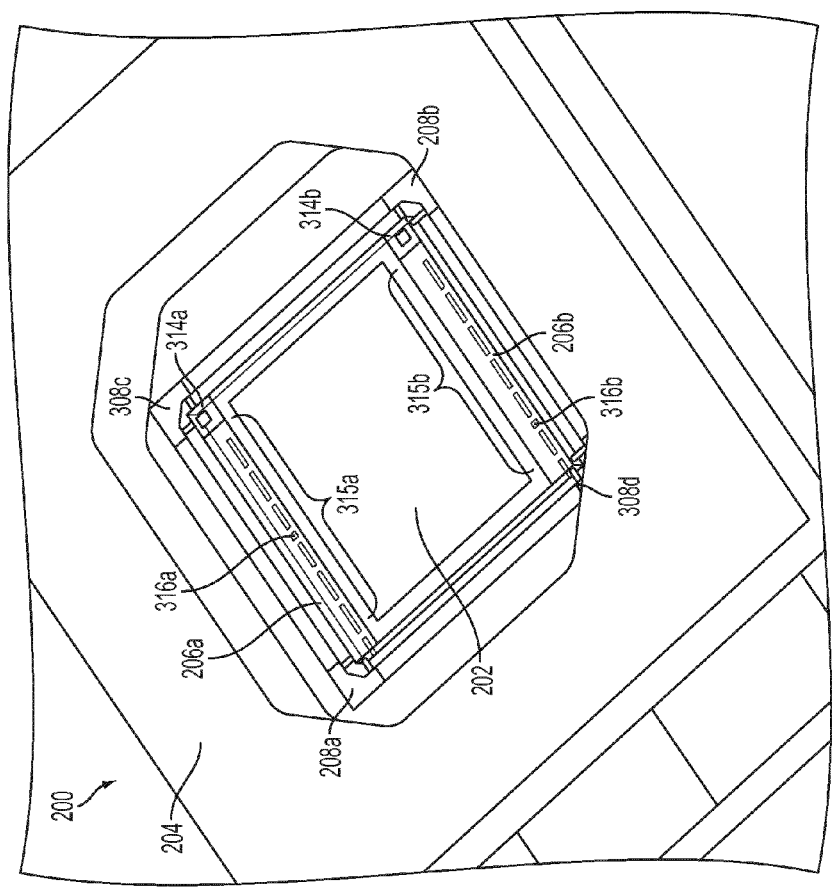
FIG. 3 depicts a perspective view of the patterning device support of FIG. 2 with the patterning device positioned on the patterning device support.

FIG. 2 depicts a perspective view of an object support 200, for example, a patterning device support or a substrate support, and a gripping device 210 of an object handling apparatus (not shown in FIG. 2) coupled with an object 202, for example, a patterning device or a substrate, according to an embodiment, and FIG. 3 depicts a perspective view of object support 200 with object 202 positioned on object support 200. In some embodiments, object 202 can be a patterning device for use in a lithographic apparatus, for example, a mask or reticle, or a substrate (for example, a wafer) for use with a lithographic apparatus. In some embodiments, object support 200 can be a patterning device support, a mask table or a reticle stage, or can be a substrate support, for example, a wafer table.

Patterning device support 200 can include a moveable component 204 configured to move patterning device 202, for example, translation along a plane or out of the plane. For example, as illustrated in FIGS. 2 and 3, patterning device 202 can translate along a plane defined by the x-axis and the y-axis (the X-Y plane). Movable component 204 can be movable relative to a second component (not shown) along a plane substantially parallel to the plane in which patterning device 202 translates. In some embodiments, the second component is movable relative to a reference, for example, a frame or balance mass (not shown).

In some embodiments, movable component 204 is a short-stroke component, and the second component (not shown) is a long-stroke component. A long stroke actuator (not shown) moves the second movable component with respect to the reference. One or more short stroke actuators (not shown) can move movable component 204 with respect to the second movable component. Typically, the short stroke actuators position movable component 204 relative to the second movable component with a relatively high accuracy. The short stroke actuators have a limited working range. Typically, the long stroke actuator has a large working range, for example, the whole working space of patterning device support 200. The long stroke actuator positions the second movable component with a relatively low accuracy. In operation, the long stroke actuator and the second movable component move patterning device 202 to a position within a workable range of the short stroke actuators that includes a desired position of patterning device 202. Then the short stroke actuators and movable component 204 move patterning device 202 to the desired position.

First movable component 204 and the second component can have any suitable shape.

In some embodiments, patterning device support 200 can include one or more clamping interfaces configured to selectively and securely couple patterning device 202 to moveable component 204. As shown in FIGS. 2 and 3, for example, patterning device support 200 can include a first clamping interface 206a and a second clamping interface 206b. Each clamping interface 206a and 206b can be configured to selectively and substantially couple with patterning device 202 to prevent movement of patterning device 202 relative to moveable component 204.

In some embodiments, each clamping interface, for example, clamping interfaces 206a and 206b, can be in fluid communication with a vacuum generator, for example, any suitable device capable of creating a negative pressure at each clamping interface. In some embodiments, clamping interfaces 206a and 206b can be membranes that create, for example, a leaking vacuum seal that securely couples patterning device 202 to moveable component 204. In such membrane embodiments, clamping interfaces 206a and 206b can each define one or more openings 314a and 314b, respectively, for allowing fluid flow there through to create a vacuum force that pulls patterning device 202 against clamping interfaces 206a and 206b, coupling patterning device 202 to moveable component 204. The vacuum force generates friction between patterning device 202 and clamping interfaces 206a and 206b. This friction can prevent internal stresses of patterning device 202 from being either partially or fully relieved after gripping device 210 releases patterning device 202.

In some vacuum embodiments, the lithographic apparatus is configured such that the magnitude of the vacuum force pulling patterning device 202 against clamping interfaces 206a and 206b is selectively reduced or set equal to about atmospheric pressure such that the normal force between patterning device 202 and clamping interfaces 206a and 206b (and therefore the friction between patterning device 202 and clamping interfaces 206a and 206b) is decreased and, in some embodiments, significantly decreased. In some embodiments, reducing the friction between patterning device 202 and clamping interfaces 206a and 206b can allow for at least a partial release of internal stresses of patterning device 202 even though gravity causes patterning device 202 maintains contact with clamping interfaces 206a and 206b. In some embodiments, clamping interfaces 206a and 206b are configured such that the vacuum force generated by one of clamping interfaces 206a or 206b is selectively reduced or set equal to about atmospheric pressure while the vacuum force generated by the other clamping interface 206a or 206b is maintained above atmospheric pressure.

In some embodiments, patterning device support 200 can include one or more positive pressure applying interfaces configured to selectively apply an area of positive fluid pressure on a surface of patterning device 202, for example, a lower planar surface of patterning device 202. In some embodiments, the positive pressure is introduced between patterning device 202 and a surface of movable component 204 that supports patterning device 202. In some embodiments, the positive fluid pressure applying interfaces are configured to apply an area of positive fluid pressure on a localized portion or, in some embodiments, an entire portion of a surface of patterning device 202. In some embodiments, each positive pressure applying interface can be in fluid communication with a pressure differential generator, for example, any suitable device capable of creating a positive pressure at each positive pressure applying interface. In some embodiments, the one or more positive pressure applying interfaces comprise the same pressure-membranes that compose the one or more clamping interfaces 206a and 206b. For example, fluid flow through the openings defined by the membranes 206a and 206b can be reversed to create a positive overpressure underneath patterning device 202, instead of a downward vacuum force.

In some embodiments, the positive pressure applying interfaces are separate components from clamping interfaces 206a and 206b. For example, as best seen in FIG. 3, patterning device support 200 can include a first pressure applying interface 315a and a second pressure applying interface 315b that can separately or collectively form an area of positive pressure in some embodiments. In some embodiments, pressure applying interfaces 315a and 315b can each comprise a membrane that defines, for example, openings 316a and 316b, respectively, for allowing fluid flow to create the area of positive pressure.

In some embodiments, the area of positive fluid pressure can be applied on sides of clamping interfaces 206a and 206b that face patterning device 202. In some embodiments, the magnitude of the positive fluid pressure is greater than the atmospheric pressure. In some embodiments, the area of positive pressure floats at least a portion of patterning device 202 at a distance from surfaces of clamping interfaces 206a and 206b, when patterning device 202 is positioned near the clamping interfaces 206a and 206b. In some embodiments, the area of positive pressure is a self-equilibrating pressure that generates a net force to a surface of patterning device 202 in a direction away from clamping interfaces 206a and 206b, such that the entire patterning device 202 floats at a distance from clamping interfaces 206a and 206b; the area of positive pressure creates an air bearing. In these embodiments in which the entire patterning device 202 floats, there is no or substantially no friction between patterning device 202 and clamping interfaces 206a and 206b because of the air bearing, which allows internal stresses in patterning device 202 to be partially or fully released.

In some embodiments, the area of positive pressure generates a net force to a surface of patterning device 202 in a direction away from clamping interfaces 206a and 206b that is less than the weight of patterning device 202. In such embodiments, although a portion or all of patterning device 202 may maintain contact with a surface of clamping interfaces 206a and 206b, the normal force between patterning device 202 and clamping interfaces 206a and 206b can be reduced, and the contact area between patterning device 202 and clamping interfaces 206a and 206b can be reduced. The reduction in the normal force or in the contact area will decrease the friction between patterning device 202 and clamping interfaces 206a and 206b, allowing internal stress in patterning device 202 to be partially or fully released.

In some embodiments, the area of positive pressure generates an asymmetric force distribution—more force will be applied to one portion of patterning device 202 than another portion of patterning device 202. This asymmetric force distribution can cause patterning device 202 to rotate, for example, about the x-axis or the y-axis. This rotation can cause one portion of patterning device 202 to maintain contact with clamping interface 206a or clamping interface 206b while floating another portion of patterning device 202 a distance from clamping interfaces 206a or 206b. Maintaining contact between at least one portion of patterning device 202 and clamping interfaces 206a or 206b reduces the movement of patterning device 202 relative to movable component 204, which helps ensure a known position of patterning device 202. For example, in some embodiments in which clamping interfaces 206a and 206b also function as positive pressuring generating interfaces, interface 206a can apply an area of positive pressure having a magnitude that varies, for example, increases from a constraint device 208a to a constraint device 308c. And interface 206b can apply an area of positive pressure having a magnitude that increases from a constraint device 308d to a constraint device 208b.

The duration that the area of positive pressure is applied can vary. In some embodiments, the area of positive pressure can be applied over an extended duration of time, for example, during the entire exposure process. In some embodiments, the area of positive pressure is applied over a short duration. For example, the short duration can range from about 0.1 second to about 1.0 second. In some embodiments, the short duration can be about 0.2 second. In some embodiments, the short duration of positive pressure generation reduces the movement of patterning device 202 relative to movable component 204, which helps ensure a known position of patterning device 202. In some embodiments, area of positive pressure is applied over duration greater than about 1.0 seconds.

The generation of positive pressure can be periodic. For example, positive pressure can be applied for a first duration, for example, about 0.2 second, ceased for a second duration, for example, about 0.5 second, and applied again for a third duration, for example, about 0.2 second. This periodic sequence can be repeated one or more times, and the durations can vary between each sequence.

Movable component 204 can be configured to oscillate, for example, shake, when coupled to patterning device 202. This oscillation can cause patterning device 202 to slip relative to clamping interfaces 206a and 206b by overcoming the static friction force between patterning device 202 and clamping interfaces 206a and 206b. And in turn, this slippage allows internal stresses in patterning device 202 to be fully or partially relieved. In some embodiments, movable component 204 oscillates while the area of positive pressure is being applied. The oscillation direction can be in any degree of freedom. For example, the oscillation can be translation along the x-axis, y-axis, or z-axis; rotation about the x-axis, y-axis, or z-axis; or any combination of these translations and rotations. In some embodiments, the oscillation frequency can be noisy—a wide frequency spectrum. In some embodiments, the oscillation frequency can be one or more discrete frequencies. For example, the oscillation frequency can be tuned to excite specific eigenmodes of movable component 204 or patterning device 202, which maximizes the excitation of the contact surface.

In some embodiments, patterning device support 200 can include one or more acoustic wave generating interfaces (not shown) configured to selectively apply acoustic vibrations that contact either clamping interfaces 206a and 206b or patterning device 202. The acoustic vibrations cause patterning device 202 to slip relative to clamping interfaces 206a and 206b by overcoming the static friction force between patterning device 202 and clamping interfaces 206a and 206b. And in turn, this slippage allows internal stresses in patterning device 202 to be fully or partially relieved. In some embodiments, acoustic vibrations are applied while the area of positive pressure is being applied or while movable component 204 oscillates. In some embodiments, the acoustic wave generating interfaces are embedded in clamping interfaces 206a and 206b. In some embodiments, clamping interfaces 206a and 206b also function as the acoustic wave generator interface. In such embodiments, an acoustic wave generator can be coupled to a vacuum line in fluid communication with clamping interfaces 206a and 206b. In some embodiments, the acoustic vibration frequency can be noisy—a wide frequency spectrum. In some embodiments, the acoustic vibration frequency can be one or more discrete frequencies. For example, the acoustic vibration frequency can be tuned to excite specific eigenmodes of movable component 204 or patterning device 202, which maximizes the excitation of the contact surface.

In some embodiments, patterning device support 200 can also include one or more constraint devices that are configured to constrain patterning device 202, such that movement of patterning device 202 in the plane in which it translates is substantially prevented, while patterning device 202 floats at a distance from the clamping interfaces 206a and 206b. In some embodiments, as seen in FIGS. 2 and 3, patterning device support 200 can include four constraint devices 208a, 208b, 308c, and 308d. In some embodiments, constraint devices 208a, 208b, 308c, and 308d are positioned at the corners of patterning device 202. In some embodiments, constraint devices 208a, 208b, 308c, and 308d can substantially prevent movement of patterning device 202 in the X-Y plane—translation along the x-axis and the y-axis, and rotation about the z-axis. In some embodiments, constraint devices 208a, 208b, 308c, and 308d can be force generating devices that each apply one or more forces to patterning device 202 to constrain movement of patterning device 202 in the X-Y plane. In some embodiments, this in-plane constraint helps ensure a known position of patterning device 202 by preventing movement of patterning device 202 relative to patterning device support 200, for example, while a positive area pressure is applied, movable component 204 oscillates, or acoustic vibrations are applied.

In some embodiments, constraint devices 208a, 208b, 308c, and 308d comprise springs. In some embodiments, constraint devices 208a, 208b, 308c, and 308d comprise gas bearings.

Figure 5:
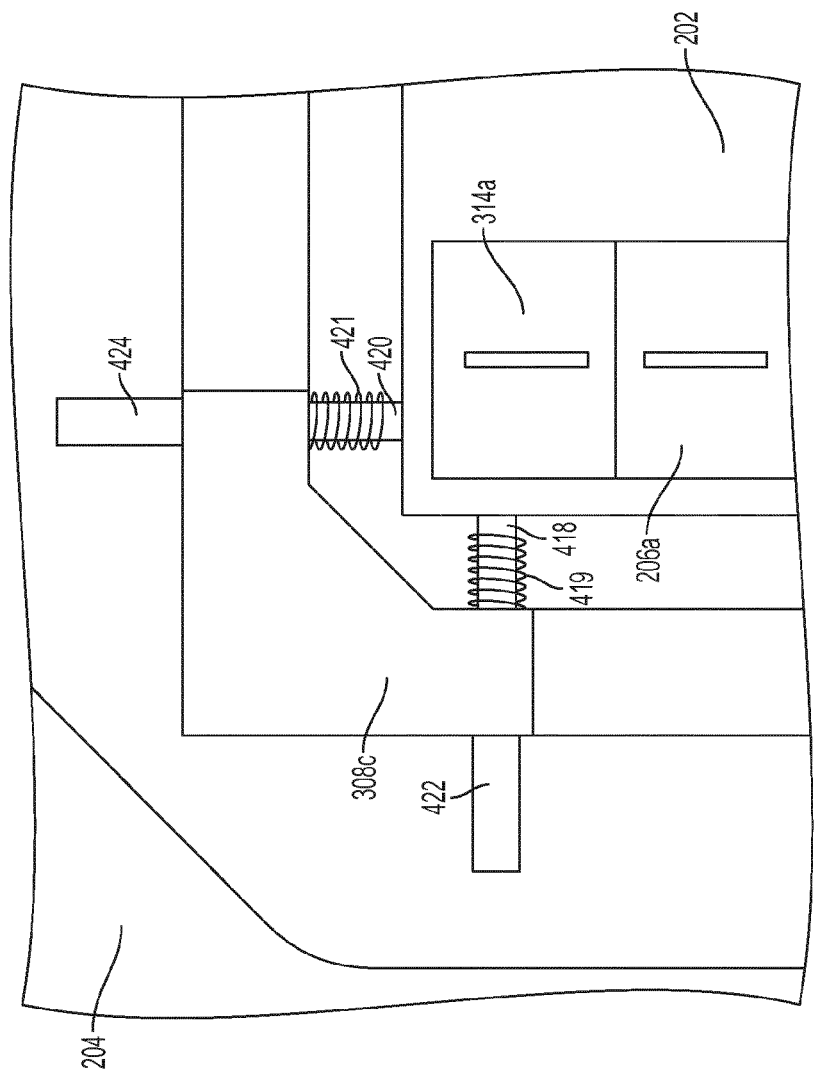
FIG. 5 depicts an enlarged plan view of a constraint device according to an embodiment.

In some embodiments, constraint devices 208a, 208b, 308c, and 308d each comprise one or more fluid actuated pistons. FIG. 5 depicts an enlarged plan view of constraint device 308c according to an embodiment. As shown in FIG. 5, constraint device 308c includes a first fluid actuated piston 418 operatively coupled to a fluid line 422. Changes in fluid pressure in fluid line 422 causes first fluid actuated piston 418 to contact patterning device 202 to apply a first force or move away from and release contact with patterning device 202 to stop applying the first force. Constraint device 308c can also include a second fluid actuated piston 420 operatively coupled to a second fluid line 424. Changes in fluid pressure in second fluid line 424 causes first fluid actuated piston 420 to move towards and contact patterning device 202 to apply a second force or move away from and release contact with patterning device 202 to stop applying the second force. In some embodiments, when pistons 418 and 420 are not in contact with patterning device 202, pistons 418 and 420 can function as patterning device bumpers.

In some embodiments, the directions of the first force and the second force generated by pistons 418 and 420, respectively, are substantially parallel to the plane (for example, the X-Y plane) in which patterning device 202 translates. In some embodiments, the direction of the first force generated by first piston 418 is substantially perpendicular to the direction of the second force generated by second piston 420.

In some embodiments, force generating device 308c can include springs 419 and 421 operatively coupled to pistons 418 and 420, respectively, for biasing pistons 418 either in a direction towards patterning device 202 or away from patterning device 202.

In some embodiments, constraint devices 208a, 208b, and 308d can be similarly constructed according to the above described embodiments.

In some embodiments, patterning device support 200 comprises a first constraint device, for example, constraint device 208a, that applies a first force to patterning device 202 in a first direction, for example, in a direction substantially parallel to the y-axis. Patterning device support 200 can also include a second constraint device, for example, constraint device 308c, that applies a second force to patterning device 202 in a second direction substantially parallel the y-axis and opposite of the first direction. In such embodiments, this force application constrains patterning device 202 along the y-axis. A similar configuration can be used to constrain patterning device 202 along the x-axis.

In some embodiments, the one or more constraint devices apply one or more forces on patterning device 202, such that a position of patterning device 202 with respect to movable component 204 is within a tolerance of movable component 204, for example, a chuck, and a pre-alignment system. In some embodiments, the constraint devices apply one or more forces on patterning device 202 that have magnitudes that minimize or prevent damage to patterning device 202 over its useful life.

Figure 4:
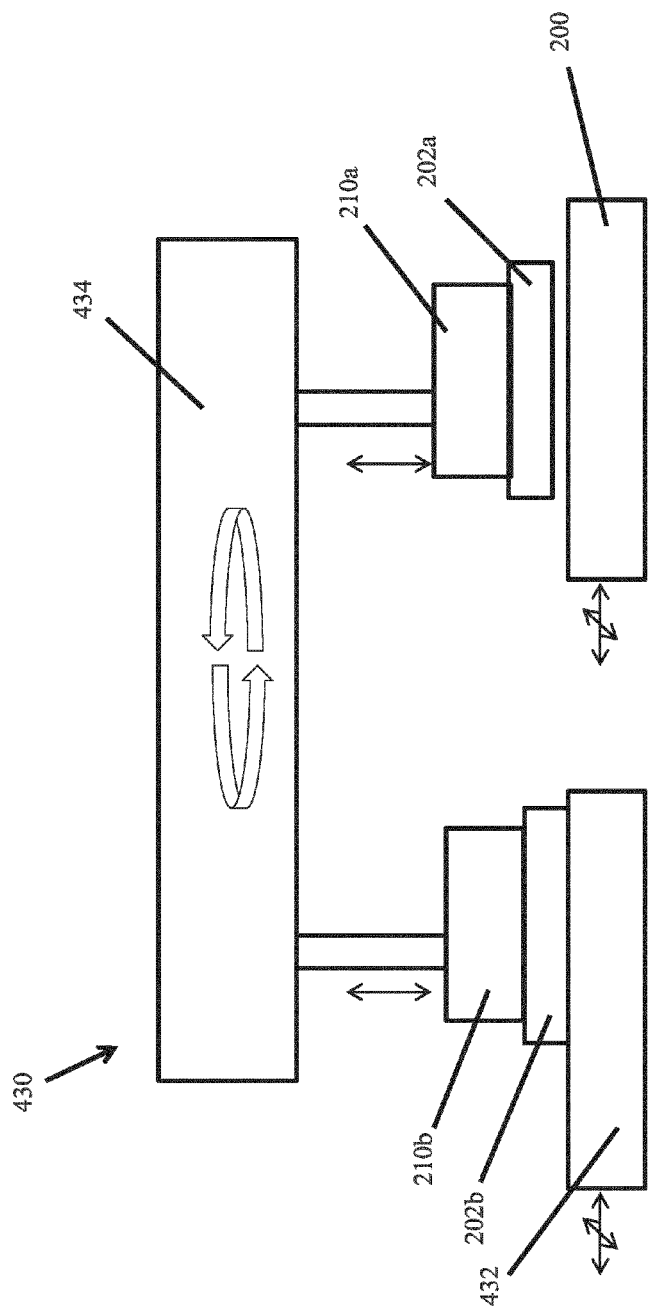
FIG. 4 schematically illustrates a patterning device handling apparatus according to an embodiment.

In some embodiments, patterning device 202 is transferred or exchanged from a gripping device 210 of a patterning device handling apparatus (not shown in FIG. 2) to patterning device support 200 in a manner that residual stresses or deformation in patterning device 202 are reduced or eliminated before patterning device 202 is securely coupled to movable component 204 for operational use. In some embodiments, the patterning device handling apparatus is a turret-type handling apparatus 430 as schematically illustrated in FIG. 4. Device handling apparatus 430 can be configured to move a patterning device from a storage location 432, for example, a patterning device handling robot, to patterning device support 200, for example, to a position proximal to the clamping interfaces of the patterning device support 200. In some embodiments, patterning device handling apparatus 430 comprises a rotatable turret 434 and at least two gripping devices 210a and 210b attached to turret 434. Patterning device handling apparatus 430 can be configured such that as gripping device 210a positions a patterning device 202a proximal to the clamping interfaces of patterning device support 200, second gripping device 210b is retrieving a second patterning device 202b from storage location 432. Turret 434 can then rotate (not shown in FIG. 4) such that gripping device 210b position patterning device 202b proximal to the clamping interfaces of the patterning device support 200. This configuration can increase device throughput.

Gripping device 210 couples patterning device 202 to the patterning device handling apparatus as the handing device moves patterning device 202 close to patterning device support 200. The pressure applying interface 315 of patterning device support 200 can create an area of positive fluid pressure between the clamping interfaces 206a and 206b of patterning device support 200 and patterning device 202, such that patterning device 202 floats at a distance from surfaces of clamping interfaces 206a and 206b. After generating the positive pressure, patterning device 202 can be uncoupled from gripping device 210. For example, a vacuum generated by vacuum units 212 of gripping device 210 can be fully released to uncouple patterning device 202, and gripping device 210 can be moved out of contact with patterning device 202.

In some embodiments, after patterning device 202 is uncoupled from gripping device 210, patterning device 202 is constrained such that movement of patterning device 202 in a plane (for example, the X-Y plane) is substantially prevented during the transfer of patterning device 202 from gripping device 210 to patterning device support 200. In some embodiments, this in-plane constraint is applied while patterning device 202 floats at a distance from a surface of the clamping interfaces, for example, clamping interfaces 206a and 206b. In some embodiments, this in-plane constraint is applied by using one or more constraint devices, for example, constraint devices 208a, 208b, 308c, and 308d as described above with reference to FIGS. 2-4. In some embodiments, other suitable constraint devices are used.

Patterning device 202 can then be selectively and securely coupled to patterning device support 200. For example, clamping interfaces 206a and 206b can be activated, for example, by creating a vacuum that couples patterning device 202 to movable component 204 of patterning device support 200, substantially preventing movement of patterning device 202 relative to movable component 204. During the period of time in which patterning device 202 is uncoupled from both gripping device 210 and patterning device support 200 and floating at a distance from a surface of the clamping interface(s), residual stresses and deformations in patterning device 202 can be partially or completely released.

Figure 7:
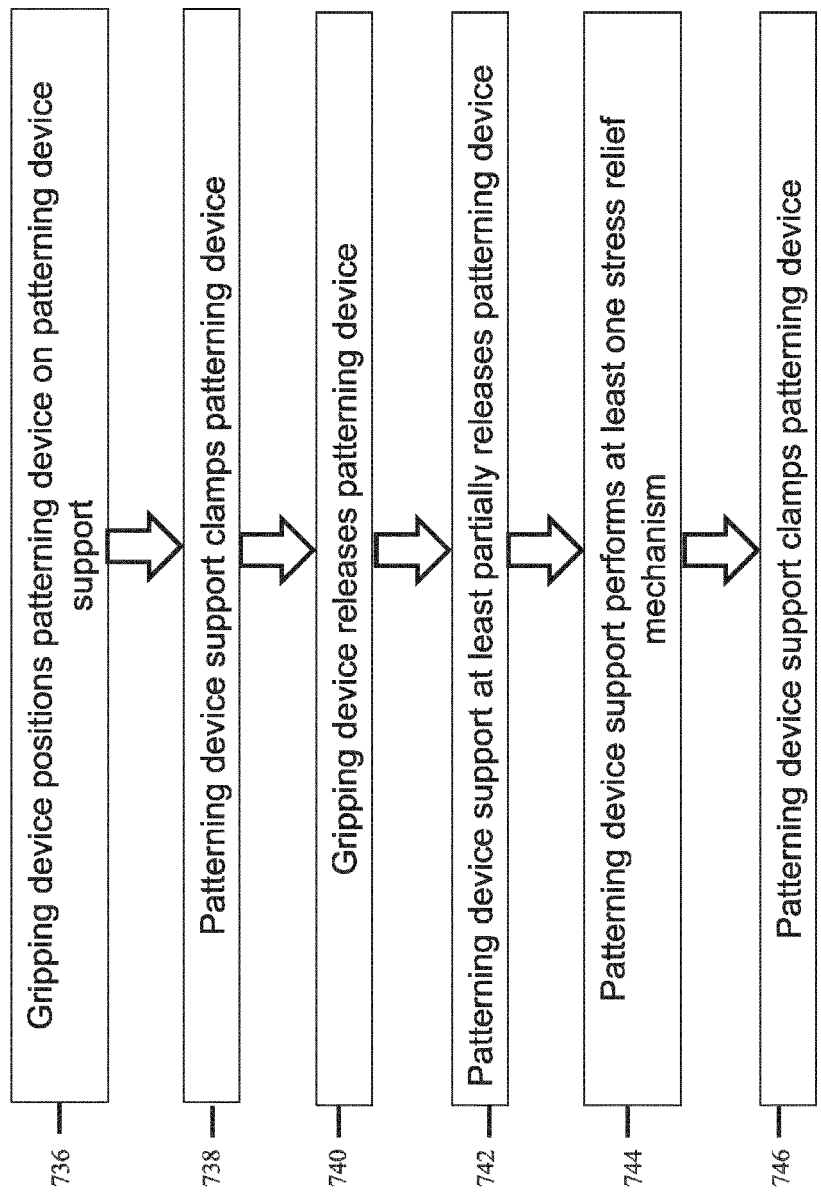
FIG. 7 illustrates a block diagram of a method of loading a patterning device according to an embodiment.

In some embodiments, a patterning device is transferred or exchanged from a gripping device to a patterning device support in manner, such that any residual stresses or deformation in the patterning device are reduced or eliminated. FIG. 7 schematically illustrates a method of loading patterning device 202 onto patterning device support 200 according to an embodiment. At step 736, gripping device 210 couples to patterning device 202 and positions patterning device 202 onto patterning device support 200, for example, proximal to clamping interfaces 206a and 206b. At step 738, patterning device support 200 securely couples patterning device 202 thereto. For example, clamping interfaces 206a and 206b can generate a vacuum force to substantially prevent patterning device 202 from moving relative to patterning device support 200. At step 740, gripping device 210 releases patterning device 202 and is moved away from patterning device support 200. At step 742, patterning device support 200 at least partially or, in some embodiments, fully releases patterning device 202. For example, a vacuum force applied by clamping interfaces 206a and 206b can be partially reduced or, in some embodiments, completely eliminated. In some embodiments, internal stresses of patterning device 202 can be released at step 742 because the normal force between patterning device 202 and patterning device support 200 is reduced, which reduces friction.

Figure 6:
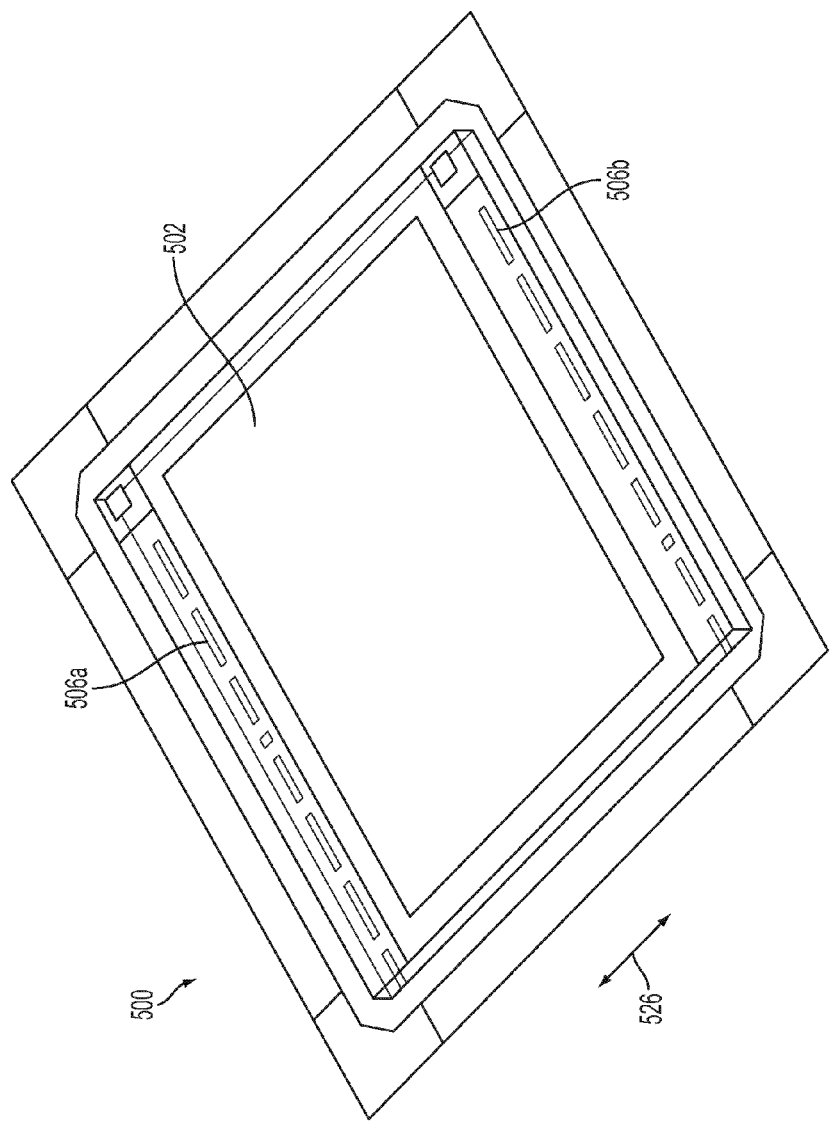
FIG. 6 depicts a perspective view of a patterning device positioned at a clamping interface of a patterning device support according to an embodiment.

At step 744, patterning device support 200 performs at least one stress relief process. In some embodiments, a positive pressure between clamping interfaces 206a and 206b and patterning device 202 can be applied as described above at step 744. In some embodiments, movable component 204 oscillates as described above at step 744. In some embodiments, acoustic vibrations are applied as described above at step. In some embodiments, patterning device support 200 at least partially or, in some embodiments, fully releases internal stresses in patterning device 202. In some embodiments, two or more of the stress relief processes can be performed sequentially or simultaneously. For example, in some embodiments, a positive pressure can be applied while movable component 204 oscillates. Or for example, FIG. 6 depicts a perspective view of patterning device 502 positioned at the clamping interface(s), for example, clamping interfaces 506a and 506b as shown in FIG. 6, of a patterning device support 500, after decoupling patterning device 502 from the gripping device of the patterning device handling apparatus (not shown) and positioning patterning device 502 at the clamping interface(s), movable component 204 can oscillate causing patterning device 502 to oscillate or vibrate. For example, a movable component (not shown) of patterning device support 500 can oscillate in the directions indicated by arrow 526. In some embodiments, the movable component oscillates in directions substantially parallel to the plane in which patterning device 502 translates. In some embodiments, the movable component oscillates in a direction out of the plane in which patterning device 502 translates. This oscillation can reduce or eliminate residual stresses or distortion in patterning device 502 that were generated by being coupled to the gripping device (not shown) of the patterning device handling apparatus. In some embodiments, the oscillation overcomes the friction between patterning device 502 and patterning device support 500, for example, at clamping interfaces 506a and 506b, due to the weight of patterning device 502, which allows the release of the residual stresses or distortions. In some embodiments, the movable component (not shown) oscillates while patterning device 502 is not securely coupled with patterning device support 500. For example, in some embodiments in which the clamping interfaces 506a and 506b comprise vacuum pads, neither the vacuum pad of clamping interface 506a nor the vacuum pad of clamping interface 506b is activated during the oscillations. In some embodiments, the movable component oscillates while patterning device 502 is partially coupled with support 500. For example, in some embodiments in which the clamping interfaces 506a and 506b comprise vacuum pads, one of the vacuum pads of clamping interfaces 506a or 506b is activated during the oscillations. The frequency, amplitude, and duration of the oscillations of the movable component can vary.

At step 746, patterning device support 200 re-couples to patterning device 202. For example, clamping interfaces 206a and 206b can be coupled with patterning device 202 to prevent movement of patterning device 202 relative to moveable component 204. Device manufacturing steps can be performed after step 746.

Figure 8B:
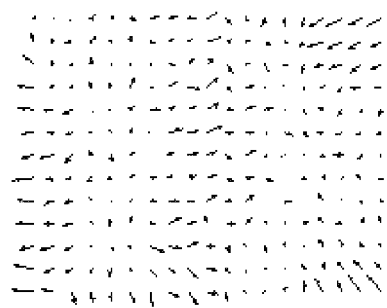
FIGS. 8A-8D illustrate the average difference in overlay offsets between two gripping devices according to various loading embodiments.
Figure 8D:
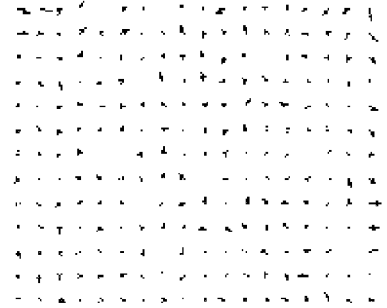
Figure 8A:
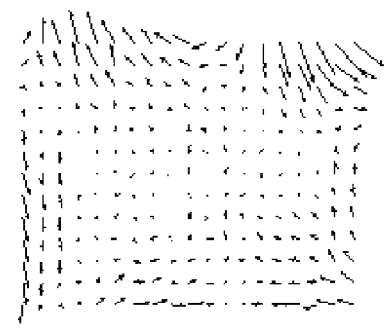
Figure 8C:
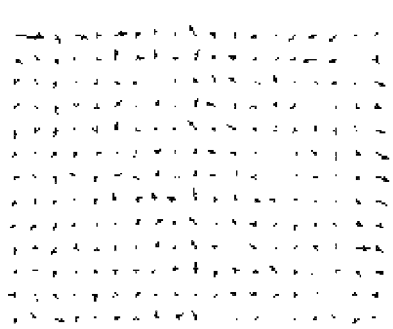

In some embodiments, performing one or more of steps 736, 738, 740, 742, 744, and 746 relieves any residual stresses or deformation in patterning device 202. Removing or at least reducing these residual stresses in patterning device 202 can improve reproducibility of patterning device distortion from load-to-load, reticle-to-reticle, gripper-to-gripper, and machine-to-machine. For example, FIGS. 8A-8D illustrate the average difference in overlay offsets between two gripping devices according to (1) a loading method in which no stress relief process was performed, (2) a loading method in which a positive air pressure was applied for a duration of about 0.5 seconds and movable component 204 was oscillating about the y-axis; (3) a loading method in which a positive air pressure was applied for a duration of about 0.5 seconds; and (4) a loading method in which a positive air pressure was applied for a duration of about 0.2 seconds. As shown FIGS. 8A-8D, the average difference in overlay offsets was smaller—better reproducibility—in FIGS. 8B-8D compared to FIG. 8A. Notably, the smallest average difference in overlay offset was when positive air pressure was applied for about 0.2 seconds.

The sequence of steps 736, 738, 740, 742, 744, and 746 vary depending on the application. In some embodiments, steps 736, 738, 740, 742, 744, and 746 occur sequentially as illustrated in FIG. 7. In some embodiments, one or more of steps 736, 738, 740, 742, 744, and 746 occur simultaneously. For example, in some embodiments, step 744—stress relief—occurs simultaneously with step 736—while gripping device 210 moves toward patterning device support 200—or simultaneously with step 740—while gripping device 210 moves away from patterning device support 200. In some embodiments, stress relief step 744 occurs before step 740—gripping device 210 releases pattering device 202. In some embodiments, one or more of steps 736, 738, 740, 742, 744, and 746 can be omitted. For example, in some embodiments, steps 738 and 742—the patterning device support 200 securely couples patterning device 202 thereto and then at least partially releases patterning device 200—can be omitted before patterning device support 200 performs at least one stress relief process at step 744.

Embodiments of the present invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A patterning device support comprising:
   a moveable component configured to move a patterning device and having a surface that supports the patterning device;
   a clamping interface disposed on the moveable component, the clamping interface having one or more openings and being configured to apply a negative pressure on a surface of the patterning device via the one or more openings, such that the patterning device is coupled to the moveable component;
   a pressure applying interface on the movable component, the pressure applying interface being configured to apply an area of positive pressure on the surface of the patterning device via the one or more openings of the clamping interface; and
   a first constraint device, separate from the clamping interface, configured to substantially prevent movement of the patterning device in a plane substantially parallel with the surface that supports the patterning device,
   wherein the patterning device support is configured to apply the area of positive pressure before applying the negative pressure such that a friction force between the patterning device and the surface of the movable component that supports the patterning device is reduced.

2. The patterning device support of claim 1, wherein the area of positive pressure floats at least a portion of the patterning device at a distance from the surface that supports the patterning device.

3. The patterning device support of claim 2, wherein a portion of the patterning device maintains contact with the movable component.

4. The patterning device support of claim 1, further comprising a second constraint device;
   wherein the first constraint device is configured to apply a first force to the patterning device in a first direction substantially parallel to the plane, and
   wherein the second constraint device is configured to apply a second force to the patterning device in a second direction substantially parallel to the plane, the second direction being opposite of the first direction.

5. The patterning device support of claim 4, wherein:
   the first constraint device is configured to apply a third force to the patterning device in a third direction substantially parallel to the plane, the third direction being substantially perpendicular to the first direction; and
   the second constraint device is configured to apply a fourth force to the patterning device in a fourth direction substantially parallel to the plane, the fourth direction being opposite of the third direction.

6. The patterning device support of claim 4, wherein the first and second constraint devices comprise a spring.

7. The patterning device support of claim 4, wherein the first and second constraint devices comprise at least one of a fluid-actuated piston, a piezo-electric actuator, and a linear motor.

8. The patterning device support of claim 1, wherein the clamping interface comprises a membrane.

9. The patterning device support of claim 8, wherein the pressure applying interface comprises the same membrane.

10. The patterning device support of claim 1, wherein the movable component is a component of a lithographic apparatus.

11. A method of transferring a patterning device between a patterning device handling apparatus and a patterning device support configured to move the patterning device, the method comprising:
    positioning the patterning device on a surface of the patterning device support;
    applying an area of positive pressure on a surface of the patterning device via one or more openings of a clamping interface such that a friction force between the patterning device and the surface of the patterning device support is reduced;
    after the applying, decoupling the patterning device from the patterning device handling apparatus;
    substantially preventing movement of the patterning device in a plane substantially parallel with the surface of the patterning device support using a constraint device, separate from the clamping interface; and
    after the applying, clamping the patterning device to the patterning device support by applying a negative pressure on the surface of the patterning device via the one or more openings of the clamping interface.

12. The method of claim 11, wherein the clamping the patterning device to the patterning device support comprises positioning the patterning device within a tolerance of the patterning device support and a pre-alignment system.

13. The method of claim 11, further comprising oscillating the patterning device support while the patterning device is positioned on the surface of the patterning device support.

14. The method of claim 13, wherein the oscillating the patterning device support occurs simultaneously with generating the area of positive pressure.

15. A lithographic apparatus comprising:
    a patterning device support configured to move a patterning device along a plane, wherein the patterning device support comprises:
    a moveable component configured to move a patterning device in a plane;
    a clamping interface attached to the moveable component, the clamping interface having one or more openings and being configured to apply a negative pressure on a surface of the patterning device via the one or more openings, such that the patterning device is coupled to the moveable component;
    a pressure applying interface configured to apply an area of positive pressure on the surface of the patterning device via the one or more openings of the clamping interface; and
    a constraint device, separate from the clamping interface, configured to substantially prevent movement of the patterning device in the plane,
    wherein the patterning device support is configured to apply the area of positive pressure before applying the negative pressure such that the patterning device floats a distance from a surface of the clamping interface.

16. A patterning device support comprising:
    a surface for supporting a patterning device;
    a clamping interface having a surface, the clamping interface being configured to hold the patterning device, the patterning device having a major planar surface and side edges;

a pressure applying interface positioned near the patterning device during the operational use of the patterning device, the pressure applying interface being configured to apply a net force under a portion of the major planar surface of the patterning device by applying an area of positive pressure at the portion of the major planar surface of the patterning device such that the portion of the major planar surface of the patterning device maintains contact with the surface of the clamping interface; and a first constraint device, separate from the clamping interface, configured to substantially prevent movement of the patterning device in a plane substantially parallel with the surface by bumping against the side edges of the patterning device.

17. The patterning device support of claim 16, further comprising a moveable component configured to move the patterning device and configured to oscillate the patterning device, wherein the clamping interface is coupled to the moveable component and couples the patterning device to the moveable component.

18. The patterning device support of claim 16, further comprising a second constraint device;

wherein the first constraint device is configured to apply a first force to the patterning device in a first direction substantially parallel to the plane; and wherein the second constraint device is configured to apply a second force to the patterning device in a second direction substantially parallel to the plane, the second direction being opposite of the first direction.

19. The patterning device support of claim 18, wherein:

the first constraint device is configured to apply a third force to the patterning device in a third direction substantially parallel to the plane, the third direction being substantially perpendicular to the first direction; and the second constraint device is configured to apply a fourth force to the patterning device in a fourth direction substantially parallel to the plane, the fourth direction being opposite of the third direction.

20. The patterning device support of claim 19, wherein the first and second constraint devices comprise at least one of a spring-actuated piston, a fluid-actuated piston, a piezoelectric actuator, and a linear motor.

21. A support in a lithographic apparatus, the support being configured to hold a patterning device, the support comprising:

a component configured to move the patterning device relative to a second support configured to hold a substrate onto which a radiation beam patterned by the patterning device is projected, the component having a surface that supports the patterning device and the patterning device having upper and lower planar surfaces and side edges;

a clamping interface on the component, the clamping interface having one or more openings, the clamping interface being configured to apply a negative pressure on the lower planar surface of the patterning device via the one or more openings, such that the patterning device is coupled to the component;

a pressure applying interface on the component, the pressure applying interface being configured to apply a positive pressure on an area of the lower planar surface of the patterning device via the one or more openings of the clamping interface; and a first constraint device configured to substantially prevent movement of the patterning device in a plane substantially parallel with the surface that supports the patterning device while the pressure applying interface applies the positive pressure, wherein the first constraint device is configured to apply a first force to one of the side edges of the patterning device in a first direction substantially parallel to the plane, wherein the support is configured to apply the positive pressure before applying the negative pressure, such that at least one of a normal force of the patterning device that acts on the surface of the component and a contact area between the lower planar surface of the patterning device and the surface of the component is reduced, such that a friction force between the lower planar surface of the patterning device and the surface of the component is reduced.

22. The support of claim 21, further comprising a second constraint device configured to apply a second force to another one of the side edges of the patterning device in a second direction substantially parallel to the plane, the second direction being opposite of the first direction.

23. A patterning device support comprising:

a moveable component configured to move a patterning device and having a surface that supports the patterning device;

a clamping interface on the moveable component, the clamping interface being configured to couple the patterning device to the moveable component;

a pressure applying interface disposed on the movable component, the pressure applying interface being configured to apply an area of positive pressure on a surface of the patterning device before the patterning device is coupled to the movable component such that a friction force between the patterning device and the surface of the movable component that supports the patterning device is reduced; and a first constraint device that is configured to substantially prevent movement of the patterning device in a plane substantially parallel with the surface that supports the patterning device by applying a first force to the patterning device before the patterning device is coupled to the movable component.

24. The patterning device support of claim 23, wherein the area of positive pressure floats at least a portion of the patterning device at a distance from the surface that supports the patterning device.

25. The patterning device support of claim 24, wherein a portion of the patterning device maintains contact with the movable component.

26. The patterning device support of claim 23, wherein the first constraint device is configured to apply the first force to the patterning device in a first direction substantially parallel to the plane.

27. The patterning device support of claim 26, further comprising:

a second constraint device, wherein the second constraint device is configured to apply a second force to the patterning device in a second direction substantially parallel to the plane, the second direction being opposite of the first direction.

* * * * *